US006556025B1

United States Patent
Nathan et al.

(10) Patent No.: US 6,556,025 B1
(45) Date of Patent: Apr. 29, 2003

(54) DC/LOW FREQUENCY SUB-ATTO SIGNAL LEVEL MEASUREMENT CIRCUIT

(75) Inventors: Arokia Nathan, Waterloo (CA); Yong Lu, Plymouth, MN (US); Tajinder Manku, Kitchener (CA)

(73) Assignee: University of Waterloo, Ontario (CA)

( * ) Notice: Subject to any disclaimer, the term of this patent is extended or adjusted under 35 U.S.C. 154(b) by 0 days.

(21) Appl. No.: 09/595,367

(22) Filed: Jun. 16, 2000

Related U.S. Application Data

(63) Continuation-in-part of application No. 08/985,671, filed on Dec. 5, 1997, now abandoned.

(51) Int. Cl.[7] .................. G01R 27/26; G01R 31/26; G01N 27/00; H01L 29/84
(52) U.S. Cl. .................. 324/661; 324/71.5; 324/769; 257/414
(58) Field of Search .................. 324/661, 71.5, 324/662, 768, 769, 457, 207.14, 158.1; 257/414, 253, 215, 235

(56) References Cited

U.S. PATENT DOCUMENTS

| | | | |
|---|---|---|---|
| 4,698,657 A | * | 10/1987 | Watanabe et al. ........... 257/253 |
| 4,763,078 A | | 8/1988 | Williams |
| 4,823,071 A | | 4/1989 | Ding et al. |
| 4,878,015 A | * | 10/1989 | Schmidt et al. ............ 324/71.5 |
| 5,036,286 A | | 7/1991 | Holm-Kennedy et al. |
| 5,159,516 A | * | 10/1992 | Fujihira ...................... 323/315 |
| 5,442,288 A | | 8/1995 | Fenn et al. |
| 5,453,727 A | * | 9/1995 | Shibasaki et al. ....... 324/207.21 |
| 5,645,949 A | * | 7/1997 | Young ......................... 320/137 |
| 6,239,604 B1 | * | 5/2001 | Van Lammeren et al. ...................... 324/158.1 |

OTHER PUBLICATIONS

Y. Martin, et al, "High–resolution capacitance measurement and potentiometry by force microscopy," *Appl. Phys. Lett.* 52(13) Mar. 28, 1988.

* cited by examiner

*Primary Examiner*—N. Le
*Assistant Examiner*—Anjan K. Deb
(74) *Attorney, Agent, or Firm*—Connolly Bove Lodge & Hutz LLP

(57) ABSTRACT

A method of measuring changes in signal level output of an integrated circuit sensor by providing a direct current (DC) or low frequency (AC) bias to the sensor and placing a floating gate semiconductor device on-chip and coupling the floating gate of the semiconductor device with the sensor. As a result, changes in signal level output of the sensor modulate charge at the gate. The semiconductor device in turn converts the modulated charge at the gate into output signals proportional to the changes in the signal level output. The measurement method provides a resolution in the sub-atto range.

18 Claims, 4 Drawing Sheets

DC/LOW FREQUENCY SUB-ATTO SIGNAL LEVEL MEASUREMENT CIRCUIT

CROSS-REFERENCE TO RELATED APPLICATION

The present application is a continuation-in-part of U.S. patent application Ser. No. 08/985,671 filed on Dec. 5, 1997 now abandoned for an invention entitled DC/Low Frequency Sub-Atto Farad Capacitance Measurement Circuit.

FIELD OF THE INVENTION

The present invention relates in general to signal measurement or detection, and more particularly to a method of generating output corresponding to changes in signal input received from a sensor and to an on-chip measurement circuit using a charge coupled readout scheme.

BACKGROUND OF THE INVENTION

Capacitive readout circuits can generally be classified into three basic categories, namely inductor-capacitor (LC) resonators, capacitive bridge circuits and switched capacitor circuits on an integrated circuit (IC) chip. Prior art LC resonators are difficult to implement with very low value capacitors because they must operate at extremely high frequencies, and require very high quality factors (Q) in order to resolve small frequency shifts.

Conventional capacitive bridge circuits require a perfect match of the sensor capacitance to that of the reference capacitor, which is difficult to achieve, especially with mass fabrication. The switched capacitor approach is very useful for implementation of on-chip capacitive sensors, but is complex in terms of circuit design and signal processing requirements.

In light of the limitations of conventional capacitance readout circuits, there is a need for high-resolution capacitance measurement circuits that are capable of measuring very small changes in capacitance and which can be incorporated into an integrated circuit design.

In addition to capacitance readout circuits, a need exists in other applications for high-resolution measurement circuits that are capable of detecting very small changes in the output signals generated by sensors. It is therefore an object of the present invention to provide a novel method of generating output corresponding to changes in signal input received from a sensor and a novel on-chip measurement circuit using a charge coupled readout scheme.

SUMMARY OF THE INVENTION

According to one aspect of the present invention there is provided a method of generating output corresponding to a change in signal input received from a sensor comprising the steps of:

providing a direct current (DC) or low frequency (AC) bias to said sensor; and coupling a floating gate of a semiconductor device to said sensor so that changes in signal input received from said sensor modulate charge at said gate, said semiconductor device converting modulated charge into an output signal proportional to the change in the sensor input.

The floating-gate semiconductor device is responsive to changes in sensor input in the sub-atto range and converts the modulated charge at the gate into a current. The current appears as a voltage across terminals of the semiconductor device that is proportional to the change in the sensor input. In a preferred embodiment, the floating-gate semiconductor device is a metal oxide semiconductor field effect transistor (MOSFET). The gate of the MOSFET is coupled directly to the sensor. The voltage appears across the drain and source terminals of the MOSFET.

According to another aspect of the present invention there is provided a method of measuring changes in signal level output of an integrated circuit sensor comprising the steps of:

providing a direct current (DC) or low frequency (AC) bias to said sensor; and placing a floating gate semiconductor device on-chip and with the floating gate of said semiconductor device being directly coupled to said sensor so that changes in signal level output of said sensor modulate charge at said gate, said semiconductor device converting modulated charge at said gate into output signals proportional to the changes in said signal level output.

According to still yet another aspect of the present invention there is provided an on-chip signal measurement method of generating output proportional to a change in signal level output of an integrated circuit sensor using a floating gate semiconductor device, said method comprising the steps of:

DC or low frequency AC biasing said sensor;

applying the signal level output of said integrated circuit sensor to said floating gate so that a change in the signal level output modulates gate charge;

converting the modulated gate charge into an output signal proportional to the change in said signal level output.

According to still yet another aspect of the present invention there is provided a method of measuring changes in the signal level output of a sensor, on-chip, comprising the steps of DC or low frequency AC biasing said sensor; and using an on-chip charge coupled scheme to detect changes in the signal level output of said sensor and to generate output signals corresponding thereto.

According to still yet another aspect of the present invention there is provided a measurement circuit for use with an integrated circuit sensor, said measurement circuit comprising:

a DC or low frequency AC source to bias said sensor; and an on-chip floating gate semiconductor device, said semiconductor device including a drain node, a source node and a gate node, said gate node being coupled directly to said sensor so that a change in the signal level output of said sensor modulates charge at said gate node, said semiconductor device converting the change in the charge at said gate node into a drain-source current that appears as a drain-source voltage proportional to the change in said signal level output.

The present invention provides advantages in that the measurement method and circuit increases resolution sensitivity significantly (by three orders of magnitude) as compared to conventional low-level measurement techniques (i.e. measurement of changes in sensor signal level output down to the sub-atto ($10^{-18}$) range). Also, the present invention provides advantages due to the fact that a DC or low frequency AC bias is used and as a result, the design of the measurement circuit is simple. This, of course, avoids the high fabrication costs and the increased circuit topography requirements associated with conventional low-level measurement devices, which use high frequency AC signal sources.

The combined ability to measure changes in sensor signal level output at the sub-atto range and to utilize a DC or low frequency AC source allows the present measurement method and circuit to extend signal measurement applications to new levels of sensitivity as well as to introduce low level signal measurement to new fields of application not possible with prior art measurement devices. The measurement method and circuit of the present invention can be used with virtually any type of sensor and has applications in capacitance based sensors, such as microphones, sensitive pressure sensors, micro-mechanical actuators that require feedback, and in accelerometers (e.g. for automobile air bags, anti-lock brakes, etc.) to name but a few. The measurement method and circuit of the present invention is also particularly useful in integrated chip design and fabrication for in-situ characterization of interface capacitance or parasitic capacitance associated with individual components that comprise integrated circuits.

BRIEF DESCRIPTION OF THE DRAWINGS

A preferred embodiment of the present invention will now be described more fully with reference to the accompanying drawings in which:

FIGS. 5a and 5b show steps performed during fabrication of the capacitance measurement circuit of FIG. 1 and the magnetic capacitance sensor of FIG. 3a;

DETAILED DESCRIPTION OF THE PREFERRED EMBODIMENT

The present invention relates generally to a measurement circuit and method for generating an amplified output signal corresponding to a change in signal level input received from a sensor that causes very small charge variations within the measurement circuit. The sensor may for example be a capacitance sensor, a photonic sensor or a nuclear sensor. The measurement circuit can be used in virtually any environment where very small changes in output signal levels are generated by a sensor. A specific example of the present invention used to generate output signals proportional to changes in capacitance of a magnetic capacitance sensor will now be described.

Figure 1:
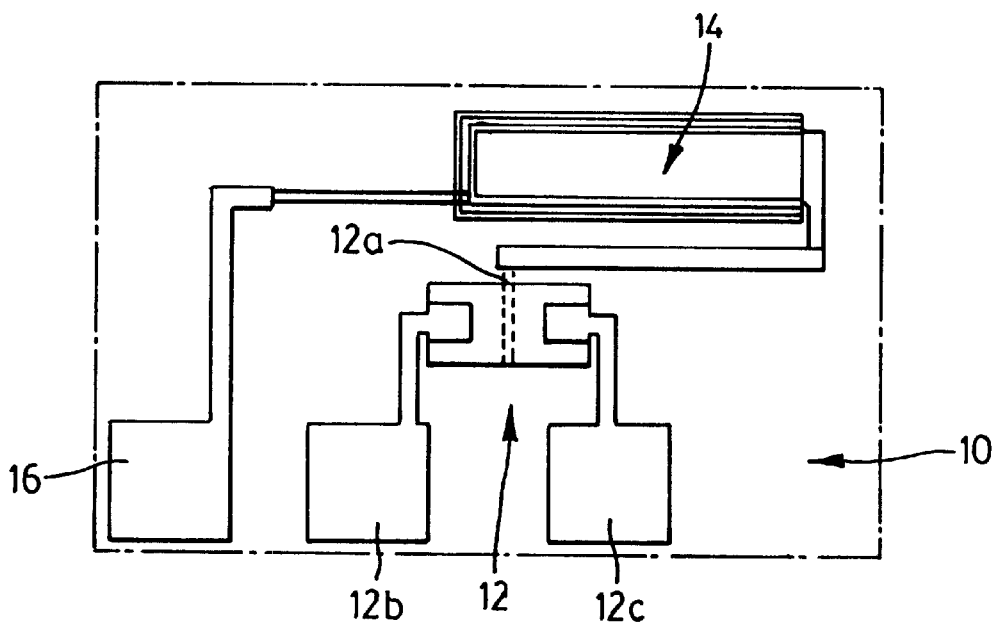
FIG. 1 is an on-chip capacitance measurement circuit in accordance with the present invention coupled to a capacitance sensor.

Referring now to FIG. 1, an on-chip capacitance measurement circuit in accordance with the present invention is shown and is generally indicated to by reference numeral 10. Capacitance measurement circuit 10 makes use of a charge coupled scheme to sense very small changes in the capacitance of a capacitance sensor 14. Specifically, the capacitance measurement circuit 10 is designed to sense changes in capacitance in the sub-atto ($10^{-18}$) Farad range and can be used in a variety of applications. The capacitance measurement circuit 10 is simple in design making it particularly suited to on-chip applications.

As can be seen in FIG. 1, capacitance measurement circuit 10 includes a floating gate metal oxide semiconductor field effect transistor (MOSFET) 12. Floating gate MOSFET 12 is directly coupled to the capacitance sensor 14. A signal input terminal 16 is connected to the capacitance sensor 14 to allow a DC or low frequency AC bias to be applied to the capacitance sensor 14.

Figure 2:
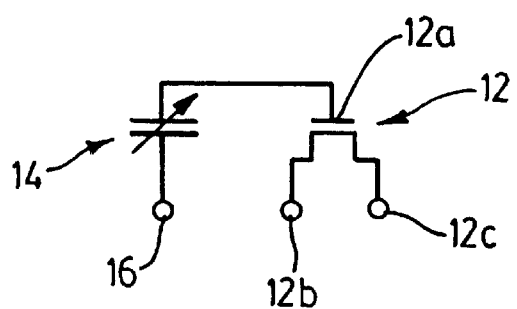
FIG. 2 is a circuit schematic of the capacitance measurement circuit and the capacitance sensor of FIG. 1.

FIG. 2 shows a circuit schematic of the capacitance measurement circuit 10 and the capacitance sensor 14. The gate terminal 12 a of the floating-gate MOSFET 12 is directly coupled to the capacitance sensor 14. Since a DC or low frequency AC bias is applied to the capacitance sensor via terminal 16, the capacitance of the capacitance sensor 14 and the gate capacitance of the floating-gate MOSFET 12 form a voltage divider. Thus, changes in capacitance of the capacitance sensor 14, modulate the gate charge of the floating-gate MOSFET 12. Modulation of the gate charge is amplified and converted into corresponding drain-source current, which appears as an output voltage $V_{DS}$ across the drain and source terminals 12b and 12c of the floating-gate MOSFET 12. Thus, the output voltage $V_{DS}$ appearing across the drain and source terminals 12b and 12c is proportional to changes in the capacitance of the capacitance sensor 14.

In order to test, the sensitivity of the capacitance measurement circuit 10, a capacitance measurement circuit 10 in accordance with the present invention and a magnetic capacitance sensor 18 were manufactured. In this example, magnetic capacitance sensor 18 is of the magnetostrictive type and changes capacitance in response to changes in applied magnetic fields. Magnetostriction describes the change in linear dimension of materials in the presence of a magnetic field. A material that has drawn significant interest for magnetic transducer applications is the Fe-based amorphous alloy family called Metglas ($Fe_{78}Si_9B_{13}$). This material has a large saturation magnetostriction and does not require a large field in order to be magnetized.

Metglas is commercially available in the form of thin ribbons. In ribbon-based magnetostrictive capacitance sensors, the magnetic field is first converted to a mechanical strain in the Metglas, which is subsequently measured by a mechanical transducer. For example, when coupled with an optical fibre, a field resolution as small as $10^{-6}$ Oe has been reported (A. D. Kersey, D. A. Jackson and M Corke, J. Lightwave Tech. LT-3, (1985) 836).

Figure 3A:
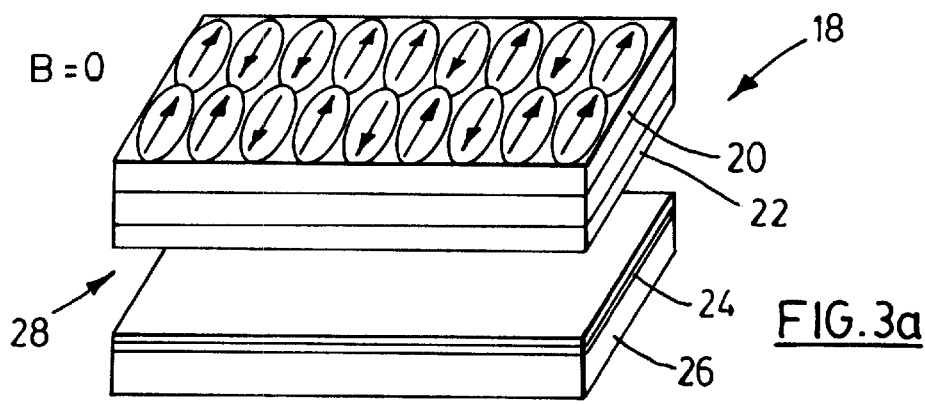
FIG. 3a shows the domain rotation of a magnetic capacitance sensor in the absence of a magnetic field.

As can be seen in FIG. 3a, magnetic capacitance sensor 18 includes a Metglas thin film 20 having pre-aligned magnetic domains disposed on a nitride cantilever beam 22. A fixed polysilicon electrode 24 disposed on an oxide layer 26 is spaced from the nitride cantilever beam 22 by an air gap 28 in the order of approximately 2 μm. The air gap 28 is realized through surface machining using Aluminum (Al) metallization as the sacrificial layer. To reduce parasitic capacitances to the circuit substrate and maintain high capacitance resolution, the terminal 16 is connected to the electrode 24 rather than to the cantilever beam 22.

Figure 3B:
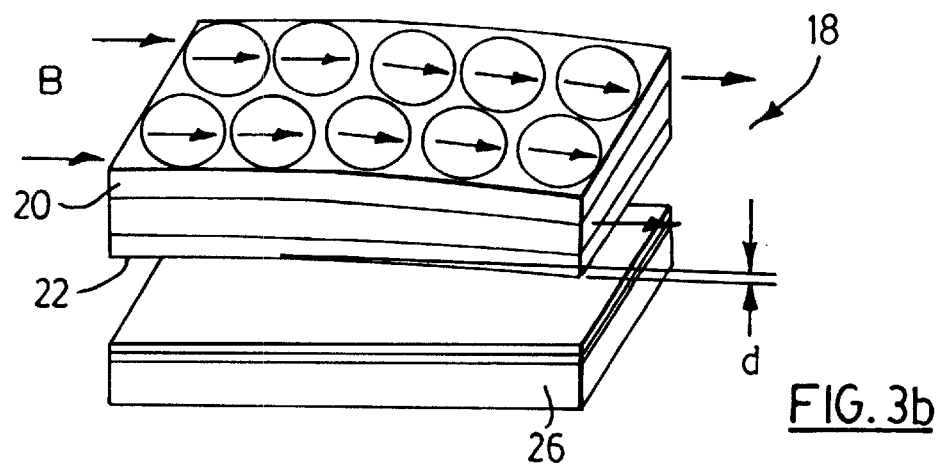
FIG. 3b shows the domain rotation of the magnetic capacitance sensor in the presence of an orthogonal magnetic field and resulting deflection of the Metglas thin film.

In the absence of a magnetic field, the nitride cantilever beam 22 is stress-free. However, in the presence of an in-plane orthogonal magnetic field, the pre-aligned magnetic domains of the Metglas thin film 20 are subject to rotation as shown in FIG. 3b. This results in a strain being induced in the cantilever beam 22 causing the cantilever beam 22 to deflect and thereby change the capacitance between the cantilever beam 22 and the electrode 24.

Figure 4:
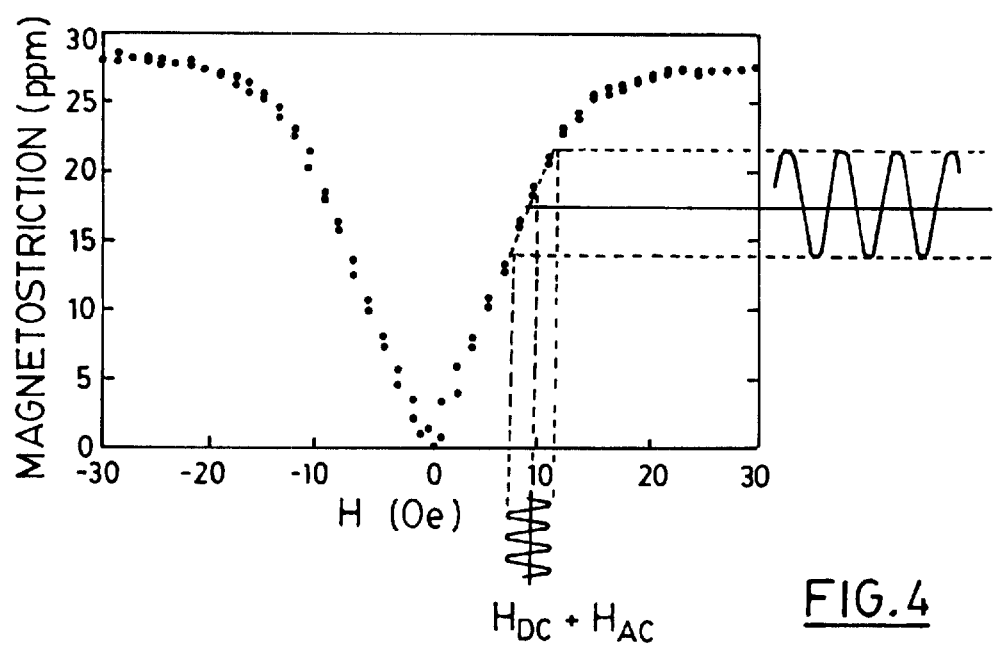
FIG. 4 shows strain induced in the Metglas thin film as a function of magnetic field H.

Turning now to FIG. 4, the magnetic response of the Metglas thin film 20 is illustrated. It will be noted that the magnetostriction is a quadratic function of magnetic field (H) at a low field value, which reaches saturation at about 15 Oe with a saturation strain of approximately 30 ppm.

Figure 5A:
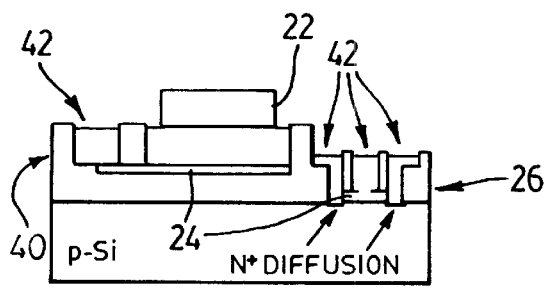
Figure 5B:
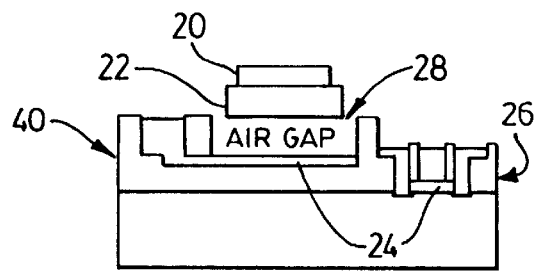

Referring now to FIGS. 5a and 5b, the fabrication sequence of the capacitance measurement circuit 10 and the magnetic capacitance sensor 18 is illustrated utilizing a single polysilicon-single metal NMOS process. The cantilever beam 22 of the magnetic capacitance sensor 18 and the Al sacrificial layer are fabricated using polygate 40 and metallization layers 42, respectively. Windows are opened in the PECVD nitride passivation layer 46 to the Al pads and to the Al sacrificial layer for surface machining. At this stage, the Metglas thin film 20 is deposited on the cantilever beam 22 and patterned using highly selective wet chemistry to leave the Al pads intact. Both deposition and patterning processes are tailored to achieve complete compatability with standard IC processes. As a final step, the Al sacrificial layer is etched, with the Metglas thin film 20 being protected by photoresist. With suitable dicing conditions employed, a high yield in fabricated structures may be obtained. Device design considerations, namely, the geometry and layer thicknesses, are based on a compromise between obtaining a large output signal and good fabrication yield.

Figure 8A:
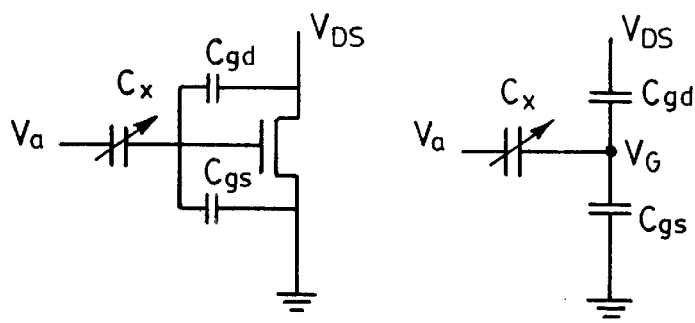
FIG. 8a is a circuit schematic showing parasitic capacitances associated with the capacitance measurement circuit of FIG. 1.
Figure 8B:
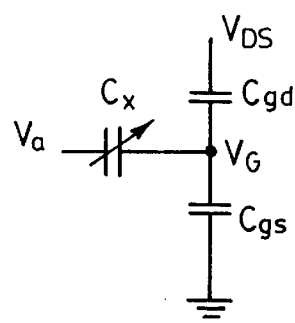
FIG. 8b is a DC equivalent circuit of the capacitance measurement circuit of FIG. 1.
Figure 6:
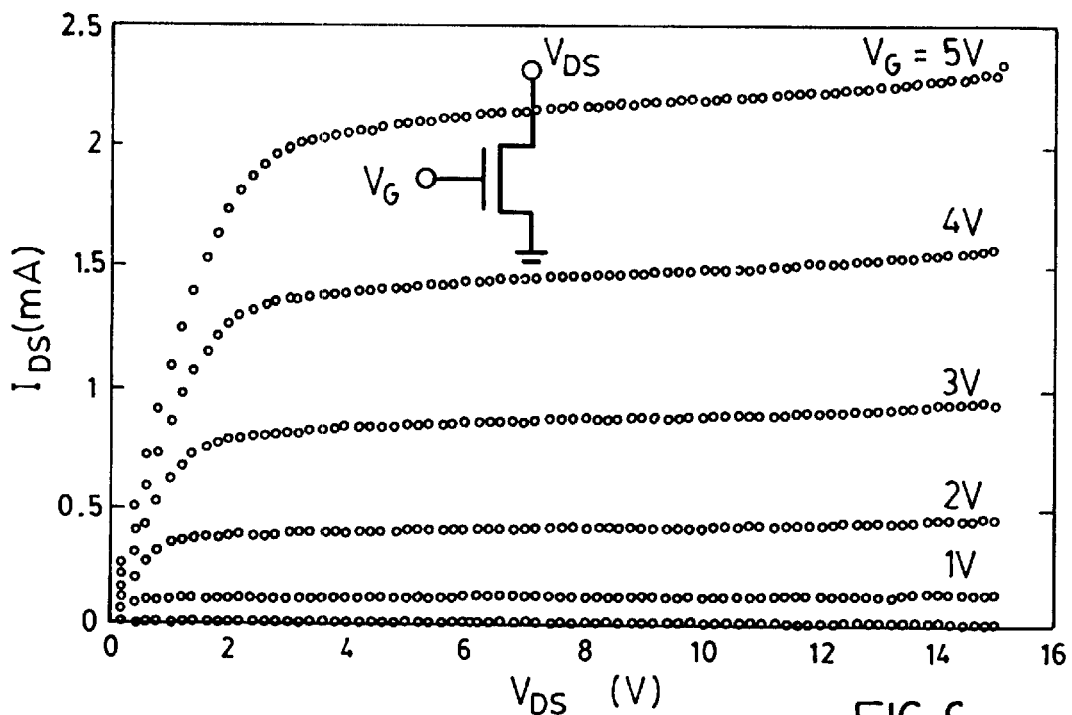
FIG. 6 shows current-voltage characteristics of the capacitance measurement circuit without the magnetic capacitance sensor.
Figure 7:
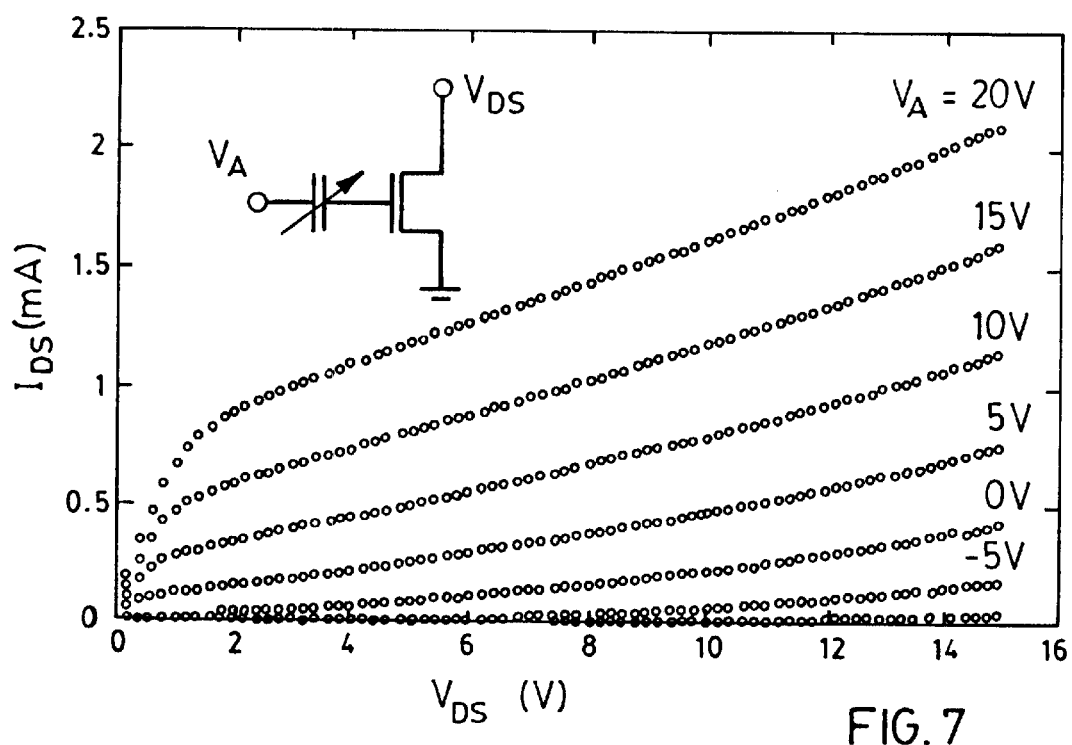
FIG. 7 shows current-voltage characteristics of the capacitance measurement circuit with the magnetic capacitance sensor.

The characteristics of the capacitance measurement circuit 10 measured with and without the magnetic capacitance sensor 18 are shown in FIGS. 6 and 7. With the capacitance $C_x$ of the magnetic capacitance sensor 18 in series with the gate capacitance of the floating-gate MOSFET 12, a reduced MOSFET transconductance is noted. However, there is also an increased current dependence on source-drain voltage $V_{DS}$ in the saturation region, due to the Miller capacitance (see FIG. 8a). Without the capacitance $C_x$ of the magentic capacitance sensor 18 in series with the gate capacitance of the floating-gate MOSFET 12, the floating-gate MOSFET 12 behavior fits the standard MOSFET equation:

$$I_{DS} = K(V_G - V_T)^2 \left(1 + \frac{V_{DS}}{V_A}\right). \quad (1)$$

with
  $K=0.07$ mA/V$^2$, $V_T=0.3$V and $V_A=90$V
where:
  $I_{DS}$ is the drain source current;
  $V_G$ is the gate voltage;
  $V_T$ is the threshold voltage; and
  $V_A$ is the bias applied to the capacitance sensor 18 necessary for the capacitance sensor to generate output in response to deflections.

With the gate capacitively coupled to the magnetic capacitance sensor 18, equation (1) still holds, but $V_G$ is dependent on both $V_A$ and $V_{DS}$:

$$V_G = \frac{C_x V_A + C_{gd} V_{DS}}{C_x + C_{gd} + C_{gs}} \quad (2)$$

Equation (2) yields good agreement with FIG. 7, for $C_{gd}/C_x=0.75$ and $(C_{gd}+C_{gs})/C_x=5.25$. The large value of Miller Capacitance, $C_{gd}$ is related to the NMOS fabrication process. The N$^+$ source and drain regions are realized using diffusion rather than implantation, according to the preferred embodiment. This leads to large source-gate and drain-gate overlaps. Capacitance $C_{gs}$ comprises three components, namely the source-gate overlap capacitance, the gate-channel capacitance and the parasitic capacitance of the interconnection between magnetic capacitance sensor 18 and the gate terminal 12a of the floating-gate MOSFET 12. By design, the capacitance $C_x$ of the magnetic capacitance sensor 18 is equal to approximately one half that of the gate-channel capacitance and the parasitic interconnect capacitance is approximately the same as that of the gate-channel capacitance.

Figure 9:
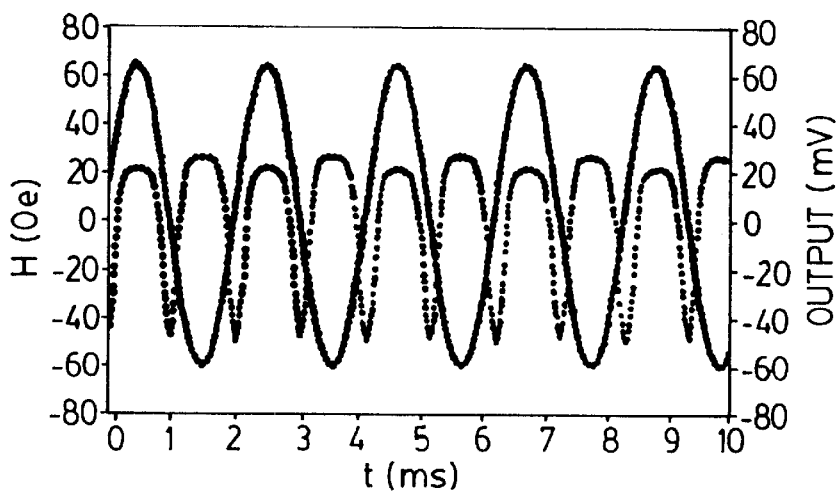
FIG. 9 shows an applied magnetic field (H) and output response for an AC magnetic field at 500 Hz with an off-chip load of 7.5 kΩ.

Magnetic measurements, with an AC magnetic field of 60 Oersteds at 500 Hz, have yielded an output voltage of up to 70 mV (see FIG. 9) without off-chip amplification. The output is composed mainly of the second harmonic of the input signal since, as discussed above, magnetostriction is a quadratic function of the magnetic field strength in the Metglas thin film 20 at low fields. The flattening of the output corresponds to the saturation of magnetic strain at high field strengths. When superimposed with a DC magnetic field, the minimum detectable AC field is 0.4 Oersteds. The corresponding voltage is 1 mV which translates to a capacitance resolution of approximately 40 aF (1 Oersted=1 Gauss in vacuum).

Although the example illustrated in FIGS. 3a to 9 shows the capacitance measurement circuit 10 used to generate output corresponding to changes in capacitance detected by a magnetic capacitance sensor 18, those of skill in the art will appreciate that the capacitance measurement circuit may be used with other types of capacitance sensors such as electrostatic, mechanical and thermal capacitance sensors. In addition, the measurement circuit may be used with other types of sensors such as optical or photonic sensors or nuclear sensors to generate output signals proportional to very small changes in the output signals-generated by the sensors.

The measurement circuit has many applications. For example, the measurement circuit may be used in pressure, force and inertial sensors, photonic and nuclear detectors, accelerometers, rate gyroscopes, resonant microactuators, microgrippers, microtweezers, micropositioners, rotational microstages, mechanical shutters, relays, micromirrors, micromotors, valves and the family of thermormechanical (biomorph) microactuators.

The measurement circuit 10 of the present invention can be optimized in several aspects. The floating-gate MOSFET fabrication process can be replaced by an industrial CMOS fabrication process, in order to reduce the Miller capacitance. The connection between sensor 14 and the gate terminal 12a of floating-gate MOSFET 12 can be redesigned to further minimize parasitic capacitances.

As will be appreciated, the measurement circuit is simple in design allowing it to be easily incorporated into integrated circuits while maintaining low topography requirements. This design in conjunction with the use of a DC or low AC bias applied to the sensor yields a charge coupled measurement scheme that exhibits a sub-atto resolution capability; This significantly extends beyond the current detection limits of prior art capacitive-based microtransducers.

Although a preferred embodiment of the present invention has been described, those of skill in the art will appreciate that variations and modifications of the present invention may be made without departing from the spirit and scope thereof as defined by the appended claims.

We claim:
1. A method of measuring sensor output using an integrated circuit sensor device including an on-chip integrated circuit sensor and a separate on-chip integrated circuit semiconductor device, said method comprising the steps of:
  providing a direct current (DC) or low frequency (AC) bias to said sensor; and tightly coupling a floating gate of said on-chip semiconductor device to said on-chip sensor so that changes in signal level output of said sensor modulate charge at said floating gate, said semiconductor device converting modulated charge at said floating gate into output signals proportional to the changes in said signal level output of said sensor.

2. The method of claim 1 wherein said semiconductor device is responsive to changes in said signal level output in the sub-atto Farad range.

3. The method of claim 2 wherein said semiconductor device converts the modulated charge at said floating gate into a current, the current appearing as a voltage across terminals of said semiconductor device that is proportional to a change in said signal level output.

4. The method of claim 3 wherein said semiconductor device is a metal oxide semiconductor field effect transistor (MOSFET), the floating gate of said MOSFET being coupled directly to said sensor, said voltage appearing across the drain and source terminals of said MOSFET.

5. A signal measurement method of generating output proportional to a change in signal level output of an integrated-circuit sensor using a floating gate integrated circuit semiconductor device, said method comprising the steps of:

fabricating an integrated circuit including said integrated circuit sensor and said floating gate semiconductor device, said integrated circuit sensor and said floating gate semiconductor device being separate, tightly coupled components;

DC or low frequency AC biasing said integrated circuit sensor;

applying the signal level output of said integrated circuit sensor to a gate of said floating gate semiconductor device so that a change in the signal level output modulates gate charge; and converting the modulated gate charge into an output signal proportional to the change in said signal level output.

6. The method of claim 5 wherein the converting step comprises the steps of converting the modulated gate charge into a drain-source current and in response generating a drain-source voltage proportional to the change in said signal level output.

7. An integrated circuit sensor device comprising:

an integrated circuit sensor; and a floating gate integrated circuit semiconductor device including a drain node, a source node and a gate node, said gate node being coupled directly to said sensor so that a change in the signal level output of said sensor modulates charge at said gate node, said semiconductor device converting the change in charge at said gate node into a drain-source current that appear as a drain-source voltage proportional to the change in said signal level output, wherein said sensor and said semiconductor device are tightly coupled but separate on-chip integrated circuit components and said semiconductor device generates an output signal in response to a change in said signal level output in the sub-atto Farad range.

8. An integrated circuit sensor device as defined in claim 7 wherein said sensor is a capacitance-sensor.

9. An integrated circuit sensor device as defined in claim 8 wherein said capacitance sensor is an electrostatic, mechanical or thermal capacitance sensor.

10. An integrated circuit sensor device as defined in claim 7 wherein said sensor is a photonic or nuclear sensor.

11. An integrated circuit sensor device as defined in claim 7 further comprising a DC or low frequency AC source to bias said sensor.

12. An integrated circuit sensor device as defined in claim 7 wherein said semiconductor device is a MOSFET device.

13. An integrated circuit sensor device as defined in claim 7 wherein said integrated circuit sensor device is incorporated into a pressure sensor, a force sensor, an inertial sensor, a photonic detector, a nuclear detector, an accelerometer, a rate gyroscope, a resonant microactuator, a microgripper, a microtweezer, a micropositioner, a rotational microstage, a mechanical shutter, a relay, a micromirror, a micromotor, a valve or a thermomechanical (biomorph) microactuator.

14. An on-chip integrated measurement circuit comprising:

an integrated circuit sensor; and a FET device including a drain node, a source node and a gate node, said gate node being coupled directly to said sensor so that a change in the signal level output of said sensor modulates charge at said gate node, said FET device converting the change in charge at said gate node into a drain-source current that appear as a drain-source voltage proportional to the change in said signal level output, wherein said sensor and said FET device are tightly coupled but separate on-chip integrated circuit components and the FET device is responsive to a change in said signal level output in the sub-atto Farad range.

15. An on-chip integrated measurement circuit as defined in claim 14 wherein said sensor is a capacitance sensor.

16. An on-chip integrated measurement circuit as defined in claim 14 wherein said capacitance sensor is an electrostatic, mechanical or thermal capacitance sensor.

17. An on-chip integrated measurement circuit as defined in claim 14 wherein said sensor is a photonic or nuclear sensor.

18. An on-chip integrated measurement circuit as defined in claim 14 wherein said measurement circuit is incorporated into a pressure sensor, a force sensor, an inertial sensor, a photonic detector, a nuclear detector, an accelerometer, a rate gyroscope, a resonant microactuator, a microgripper, a microtweezer, a micropositioner, a rotational microstage, a mechanical shutter, a relay, a micromirror, a micromotor, a valve or a thermomechanical (biomorph) microactuator.

* * * * *